US008728942B2

(12) United States Patent
Ogata et al.

(10) Patent No.: US 8,728,942 B2
(45) Date of Patent: May 20, 2014

(54) METHOD FOR PRODUCING EPITAXIAL SILICON WAFER

(75) Inventors: Shinichi Ogata, Tokyo (JP); Kazushige Takaishi, Tokyo (JP); Hironori Nishimura, Tokyo (JP); Shigeru Okuuchi, Tokyo (JP); Shunsuke Mikuriya, Tokyo (JP); Yuichi Nakayoshi, Tokyo (JP)

(73) Assignee: Sumco Corporation, Tokyo (JP)

( * ) Notice: Subject to any disclaimer, the term of this patent is extended or adjusted under 35 U.S.C. 154(b) by 38 days.

(21) Appl. No.: 13/390,764

(22) PCT Filed: Aug. 20, 2010

(86) PCT No.: PCT/JP2010/064076
§ 371 (c)(1),
(2), (4) Date: Feb. 16, 2012

(87) PCT Pub. No.: WO2011/021691
PCT Pub. Date: Feb. 24, 2011

(65) Prior Publication Data
US 2012/0156878 A1    Jun. 21, 2012

(30) Foreign Application Priority Data

Aug. 21, 2009 (JP) ................................ 2009-192450
Aug. 21, 2009 (JP) ................................ 2009-192451

(51) Int. Cl.
*H01L 21/302* (2006.01)
(52) U.S. Cl.
USPC ............. 438/692; 216/53; 216/88; 216/89; 216/90; 216/91; 438/689; 438/690; 438/691; 438/693; 257/E21.23

(58) Field of Classification Search
None
See application file for complete search history.

(56) References Cited

U.S. PATENT DOCUMENTS

| 5,578,504 | A | * | 11/1996 | Mitani et al. ............. 438/17 |
| 5,885,334 | A | * | 3/1999 | Suzuki et al. ............ 106/3 |
| 6,899,762 | B2 | * | 5/2005 | Wenski et al. ............ 117/89 |
| 2001/0047978 | A1 | * | 12/2001 | Wenski et al. ............ 216/2 |
| 2003/0186028 | A1 | | 10/2003 | Wenski et al. |
| 2005/0282718 | A1 | | 12/2005 | Nakagawa |

FOREIGN PATENT DOCUMENTS

| DE | 19938340 | | 2/2001 | |
| DE | 102005027212 | | 2/2006 | |
| JP | 3-120825 | | 5/1991 | |
| JP | 09-306881 | | 11/1997 | |
| JP | 2001-007063 | * | 1/2001 | ............ H01L 21/304 |
| JP | 2001-127016 | | 5/2001 | |

OTHER PUBLICATIONS

Y. Ogita et al., "Photoconductivity Characterization of Silicon Wafer Mirror-Polishing Substrate Demage Related to Gate Oxide Integrity", J. Crystal Growth, vol. 210, year 2000, pp. 36-39.*
Taiwanese Office Action dated Mar. 19, 2012 in counterpart application No. 099127773, along with English-language translation.

* cited by examiner

*Primary Examiner* — Lan Vinh
*Assistant Examiner* — Jiong-Ping Lu
(74) *Attorney, Agent, or Firm* — Greenblum & Bernstein, P.L.C.

(57) ABSTRACT

Mirror-polishing a front surface of a silicon wafer using polishing liquid composed of an abrasive grain-free alkaline solution including water-soluble polymers simplifies a polishing process, thus leading to an increase in productivity and a reduction in cost, and reduces the density of LPDs attributable to processing and occurring in the front surface of a mirror-polished wafer, thus improving the surface roughness of the wafer front surface.

2 Claims, 8 Drawing Sheets

METHOD FOR PRODUCING EPITAXIAL SILICON WAFER

BACKGROUND OF THE INVENTION

1. Field of the Invention

The present invention relates to a method of producing an epitaxial silicon wafer, specifically a method of producing an epitaxial silicon wafer in which an epitaxial film is vapor-deposited on a mirror-polished front surface of a silicon wafer.

2. Description of Related Art

An example of substrates for fabrication of bipolar IC devices is an epitaxial silicon wafer. Such an epitaxial silicon wafer is produced by vapor-depositing an n-type epitaxial film composed of monocrystalline silicon having a thickness of several μm on a p-type silicon wafer having low resistance (approximately 0.01 Ω·cm).

A silicon wafer having a mirror-polished front surface is produced by slicing a monocrystalline silicon ingot grown in the Czochralski (CZ) process; chamfering, lapping (grinding), and etching the sliced silicon wafer in the sequence; and then polishing the front surface of the wafer.

In a general polishing method, the front surface of the silicon wafer undergoes polishing steps including primary polishing, secondary polishing, and finish polishing in the sequence, each of which is followed by cleaning. The wafer front surface is treated through the multiple polishing steps such that, for example, polishing abrasive grains become finer and a polishing cloth becomes less hardened as the polishing proceeds to the next step so as to achieve low surface roughness of the wafer surface.

In the precision polishing method that involves such multiple steps, however, a polishing time is extended for a low-resistance wafer having a higher hardness due to repeated polishing and cleaning through the steps. Accordingly, the flatness of the front surface of the silicon wafer is degraded, thus causing pits in the wafer front surface and sagging or periodic unevenness in the external peripheral portion of the silicon wafer. Furthermore, cost is another issue in the multiple-step polishing of the silicon wafer, including primary polishing, secondary polishing, and finish polishing.

In view of such circumstances, a conventional technology is disclosed in Related Art 1, for instance. In the technology, a front surface of an etched silicon wafer undergoes only primary mirror-polishing, and then an epitaxial film is vapor-deposited on the polished surface. Polishing liquid including free abrasive grains, such as, for example, colloidal silica, is used in the primary mirror-polishing. The roughness of the primary mirror-polished surface is 0.3 nm or greater and 1.2 nm or less in RMS (root mean square) in measurement of a measurement area of 1 μm×1 μm using an atomic force microscope.

[Related Art 1] Japanese Patent Publication No. 3120825

However, the polishing liquid used in the primary mirror-polishing in Related Art 1 includes free abrasive grains. Thus, the surface roughness of the front surface of the silicon wafer after primary mirror-polishing is 0.3 nm or greater in RMS in measurement of the measurement area of 1 μm×1 μm using the atomic force microscope. This value is not deemed sufficient to meet rapid high integration of devices in these days. In addition, the RMS value is extremely high in a large measurement area of 10 μm×10 μm, and a front surface of an epitaxial film thereafter is also extremely rough.

In the case where the wafer front surface undergoes primary mirror-polishing with the polishing liquid including free abrasive grains as shown in Related Art 1, new process damage is introduced in a wafer front layer portion by mechanical action during mirror-polishing. Thus, numerous process damages having a depth of 5 nm or greater in general are caused in the primary mirror-polished surface, adversely affecting the gate oxide integrity. Furthermore, defects attributable to processing, such as micro scratches, are caused in the primary mirror-polished surface of the silicon wafer because of aggregation of free abrasive grains in the polishing liquid. Such defects lead to a number of LPDs (light point defects) in the primary mirror-polished surface. Depositing an epitaxial film on such a wafer front surface increases the density of LPDs observed in the front surface of the epitaxial film. Specifically, more than 1,000 LPDs having a size of 130 nm or greater appear in a single silicon wafer having a diameter of 300 mm.

As a result of intense research, the inventors have found that all circumstances above are solved by mirror-polishing a front surface of a silicon wafer using polishing liquid that includes water-soluble polymers but not free abrasive grains and then by vapor-depositing an epitaxial film on the wafer front surface.

The present invention provides a method of producing an epitaxial silicon wafer provided with an epitaxial film having low LPD density and low surface roughness by reducing the density of LPDs attributable to processing and caused in a mirror-polished front surface of a silicon wafer and by reducing the surface roughness of the wafer front surface.

SUMMARY OF THE INVENTION

The present invention provides a method of producing an epitaxial silicon wafer, the method including mirror-polishing a front surface of a silicon wafer using polishing liquid composed of an abrasive grain-free alkaline solution in which water-soluble polymers are added and vapor-depositing thereafter an epitaxial film on the mirror-polished front surface of the silicon wafer.

It is preferred in particular in the present invention that the method further include performing primary polishing prior to the mirror-polishing, the primary polishing using primary polishing liquid mainly composed of the alkaline solution along with abrasive grains to remove an oxide film formed on the front surface of the silicon wafer, and that the mirror-polishing be secondary polishing using the polishing liquid as secondary polishing liquid.

It is preferred in the present invention that the water-soluble polymers added in the alkaline solution be one of hydroxyethyl cellulose and polyethylene glycol.

It is further preferred in the present invention that concentration of the water-soluble polymers be 0.01 ppm to 1,000 ppm.

It is further preferred in the present invention that the alkaline solution be prepared to have a pH of 8 to 14, and that the alkaline solution be one of an alkaline solution in which any of a basic ammonium salt, a basic potassium salt, and a basic sodium salt is added as an alkaline agent; alkaline carbonate solution; an alkaline solution in which hydrazine is added; and an alkaline solution in which an amine is added.

It is further preferred in the present invention that the front surface of the mirror-polished silicon wafer have a surface roughness of less than 0.3 nm in RMS in measurement of a measurement area of 1 μm×1 μm using an atomic force microscope and a surface roughness of 0.3 nm or less in RMS in measurement of a measurement area of 10 μm×10 μm using an atomic force microscope.

It is further preferred in the present invention that gate oxide integrity of the mirror-polished silicon wafer be evaluated such that a C+mode yield is 99% or greater in TZDB measurement.

According to the present invention, the polishing liquid composed of the abrasive grain-free alkaline solution in which the water-soluble polymers are added is used to mirror-polish the front surface of the silicon wafer before the epitaxial film is deposited. With such polishing liquid composed of the abrasive grain-free alkaline solution in which the water-soluble polymers are added, the water-soluble polymers receive a portion of polishing load during polishing, thus reducing friction coefficient. Accordingly, the gate oxide integrity is excellent; defects attributable to processing, such as micro scratches, are substantially reduced; and the density of LPDs in the front surface of the epitaxial film deposited thereafter is reduced. Furthermore, mirror-polishing the front surface of the silicon wafer using the polishing liquid composed of the free abrasive grain-free alkaline solution in which the water-soluble polymers are added achieves a surface roughness of 0.3 nm or less in RMS in measurement of both measurement areas of 1 $\mu$m×1 $\mu$m and 10 $\mu$m×10 $\mu$m, thus enhancing the surface roughness quality of the epitaxial deposited thereafter.

10 Epitaxial silicon wafer
11 Silicon wafer

DETAILED DESCRIPTION OF PREFERRED EMBODIMENTS

The present invention provides a method of producing an epitaxial silicon wafer in which a front surface of a silicon wafer is mirror-polished using polishing liquid composed of an abrasive grain-free alkaline solution in which water-soluble polymers are added, and thereafter an epitaxial film is vapor-deposited on the mirror-polished front surface of the silicon wafer.

According to the present invention, the polishing liquid composed of the abrasive grain-free alkaline solution in which the water-soluble polymers are added is used to mirror-polish the front surface of the silicon wafer immediately before the epitaxial film is deposited. Thus, the wafer front surface is mirror-polished by chemical action in which alkaline etching and removal of an etched portion are repeated. This prevents process damage, which occurs due to mechanical action during mirror-polishing using abrasive grains, and thus provides a wafer extremely excellent in gate oxide integrity. In addition, abrasive grain-free polishing substantially reduces defects attributable to processing, such as micro scratches due to grain aggregation. Such polishing also reduces the density of LPDs caused in the front surface of the epitaxial film deposited thereafter.

Since the polishing liquid is the abrasive grain-free alkaline solution including the water-soluble polymers, the water-soluble polymers receive a portion of polishing load during polishing, thus reducing friction coefficient. As a result, the RMS value obtained using an atomic force microscope is reduced not only in a small measurement area of 1 $\mu$m×1 $\mu$m, but also in a large measurement area of 10 $\mu$m×10 $\mu$m. An epitaxial silicon wafer is thus produced having an epitaxial film excellent in surface roughness quality.

Adding the water-soluble polymers in the alkaline solution prevents elastic deformation of a carrier plate and reduces noise from the carrier plate. Furthermore, use of no abrasive grains reduces possibility of external periphery sagging, which is caused by excessive polishing in the external peripheral portion of the silicon wafer due to abrasive grains in polishing liquid likely to aggregate in the external peripheral portion of the wafer.

In the present invention, it is preferred that primary polishing be performed prior to the mirror-polishing, the primary polishing using primary polishing liquid mainly composed of the alkaline solution along with abrasive grains to remove an oxide film formed on the front surface of the silicon wafer, and that the mirror-polishing be provided as secondary polishing in which the polishing liquid is secondary polishing liquid.

In the present invention, only primary polishing and secondary polishing are performed without finish polishing to produce an epitaxial silicon wafer. Thus, the polishing process is simplified, thus increasing productivity of epitaxial silicon wafers and reducing cost. In addition, compared with a case of primary polishing alone including free abrasive grains, the density of LPDs is reduced which are attributable to processing and are caused in the front surface of the mirror-polished wafer, and thus the surface roughness of the wafer front surface is reduced.

Furthermore, the oxide film is removed in a short period of time by mechanical action with abrasive grains therein during the primary polishing, which is a pre-process of the secondary polishing. This achieves a high polishing rate in the secondary polishing, which is mirror-polishing by chemical action in which oxidative etching using the alkaline solution and removal of an oxide are repeated. Specifically, a natural oxide film generally exists on the front surface of the silicon wafer before the primary polishing. It is difficult to remove the natural oxide film only by chemical polishing in the secondary polishing in which the alkaline solution alone is used. Performing the primary polishing using abrasive grains before the secondary polishing allows removal of the natural oxide film in a short period of time.

That "the oxide film formed on the front surface of the silicon wafer is removed by the primary polishing with abrasive grains therein" during the primary polishing means (1) polishing by using primary polishing liquid including abrasive grains (free abrasive grains) and an abrasive grain-free polishing cloth; (2) polishing by using abrasive grain-free primary polishing liquid and a polishing cloth to which abrasive grains (fixed grains) are fixed; or (3) polishing by using primary polishing liquid including abrasive grains and a polishing cloth including abrasive grains. The polishing liquid used in the secondary polishing after the primary polishing is an abrasive grain-free alkaline solution in which water-soluble polymers are added.

Materials of abrasive grains (free abrasive grains and fixed grains) may include, for example, diamond, silica (colloidal silica), SiC, and the like.

The grain size (average grain size) of abrasive grains (free abrasive grains and fixed grains) is 5 to 200 nm. With a grain size of less than 5 nm, the polishing rate is low, thus requiring a long time to remove an oxide film. With a grain size exceeding 200 nm, scratches are likely to occur in a polished surface of a silicon wafer from which an oxide film is removed. A preferable grain size of the abrasive grains is between 10 and 100 nm. Within this range, scratches are unlikely to occur in the polished surface of the silicon wafer from which the oxide film is removed and a high polishing rate is maintained.

Examples of the oxide film may include a natural oxide film ($SiO_2$) and a thermally-oxidized film. The thickness of the oxide film is 5 to 20 Å in the case of the natural oxide film.

In the present invention, it is preferred that the gate oxide integrity of the mirror-polished silicon wafer be evaluated such that the C+mode yield is 99% or greater in TZDB measurement.

To evaluate presence of process damage in the front surface of a silicon wafer, a pass-fail test of the wafer is generally performed based on C mode evaluation by TZDB measurement. It is found that, however, even if a silicon wafer is determined to have a C mode evaluation of 99% or greater, for example, the wafer is evaluated to have a substantially low yield in the more stringent C+mode yield evaluation and have low gate oxide integrity. Thus, it is extremely important to achieve excellent gate oxide integrity, such as a C+mode yield of 99% or greater, or even 100%.

In the present invention, using the polishing liquid composed of the abrasive grain-free alkaline solution in which the water-soluble polymers are added effectively reduces process damage, including scratches attributed to mechanical factors, such as aggregation of abrasive grains, as well as reduces defects attributable to processing, such as micro scratches. Thus, the C+mode yield in TZDB measurement is 99% or greater and the pass rate is substantially 100%. Thereby, the density of LPDs can substantially be reduced in the front surface of the epitaxial film.

For the gate oxide integrity (GOI), an oxide film (gate oxide film) and an electrode are formed in the front surface of a silicon wafer to provide a MOS (metal oxide semiconductor) structure and then a voltage is applied to the electrode to break the oxide film to measure breakdown voltage and current.

The C+mode yield in TZDB (time zero dielectric breakdown) measurement employed in the present invention is calculated under the measurement conditions below.

<Measurement Conditions>

An oxide film having a gate oxide film thickness of 25 nm is formed on a wafer front surface. Polysilicon electrodes each having a gate electrode area of 10 $mm^2$ are formed on the front surface of the oxide film. A voltage is applied to each of the electrodes in a step voltage (SV) application. The voltage is increased at a step of 0.5 MV/cm (voltage application time of each step: 200 msec). A cell is referred to as C+mode, the cell having a current density of 10 $\mu A/cm^2$ or less that flows through the oxide film with application of a voltage of 8 MV/cm or greater and having a current density of 1 $\mu A/cm^2$ or less that flows through the oxide film with application of a voltage of 2 MV/cm or greater again after the applied voltage is once reduced to 0 MV/cm. The ratio of such C+mode cells is the C+mode yield.

In the present invention, it is preferred that the surface roughness of the front surface of the mirror-polished silicon wafer be less than 0.3 nm in RMS in measurement of a measurement area of 1 μm×1 μm using an atomic force microscope. Furthermore, it is preferred that the surface roughness of the front surface of the mirror-polished silicon wafer be 0.3 nm or less in RMS in measurement of a measurement area of 10 μm×10 μm using an atomic force microscope. This enhances the surface roughness quality of the epitaxial film deposited thereafter.

In the present invention, mirror-polishing the front surface of the silicon wafer using the polishing liquid composed of the abrasive grain-free alkaline solution in which the water-soluble polymers are added achieves a surface roughness of 0.3 nm or less in RMS in measurement of both measurement areas of 1 μm×1 μm and 10 μm×10 μm. This enhances the surface roughness quality of the epitaxial film deposited thereafter.

Examples of the silicon wafer may include, for example, a monocrystalline silicon wafer and a polycrystalline silicon wafer.

The diameter of the silicon wafer may be, for example, 100 mm, 125 mm, 150 mm, 200 mm, 300 mm, and 450 mm.

As the alkaline solution (including the alkaline solution for primary polishing), it is desirable to use an alkaline solution prepared to have a pH of 8 to 14. An alkaline solution having a pH of less than 8 excessively reduces the etching effect, likely to cause defects attributable to processing in the front surface of the silicon wafer, such as scratches and other flaws. An alkaline solution having a pH exceeding 14, such as a strongly basic solution, causes difficulty in handling of polishing liquid. Examples of the alkaline agent (pH adjuster) may include an ammonia solution; an alkali hydroxide solution including such as potassium hydroxide or sodium hydroxide; and an alkaline carbonate solution. In addition, a hydrazine or amine solution may be employed. In view of increasing the polishing rate, it is desirable to use an amine, in particular.

It is desirable to use hydroxyethyl cellulose and polyethylene glycol as the water-soluble polymers to be added in the alkaline solution. In particular, hydroxyethyl cellulose having high purity is relatively easily available. Due to its high molecular weight, hydroxyethyl cellulose serves as a bearing between a polishing pad and a carrier plate, thus effectively reducing friction coefficient.

It is desirable that the concentration of the water-soluble polymers added in the alkaline solution be prepared between 0.01 ppm and 1,000 ppm. The concentration of the water-soluble polymers of less than 0.01 ppm leads to excessively high friction during polishing, thus likely to cause defects attributable to processing in the mirror-polished wafer front surface. The concentration exceeding 1,000 ppm substantially reduces the polishing rate, thus requiring a long time for mirror-polishing.

In view of removal of metal ions included in the polishing liquid, it is desirable to add a chelator in the polishing liquid. With addition of the chelator, metal ions are caught and complexed, and then are discarded to reduce a level of metal contamination of the mirror-polished silicon wafer. Any material having a chelating capability relative to metal ions may be used as the chelator. Chelating means that ligands having a plurality of coordination positions bind (coordinate) with metal ions.

Types of the chelators may include, for example, a phosphonate chelating agent and an aminocarboxylic acid chelating agent. In view of solubility to the alkaline solution, however, the aminocarboxylic acid chelating agent is preferred. Furthermore, in view of chelating capability of heavy metal ions, aminocarboxylate is more preferred, such as EDTA (ethylene diamine tetraacetic acid) or DTPA (diethylene triamine pentaacetic acid). Alternatively, NTA (nitrilotriacetic acid) may be employed. It is preferred to add the chelator within a concentration range of 0.1 ppm to 1,000 ppm. Metal ions can thus be caught, including Cu, Zn, Fe, Cr, Ni, and Al.

The polishing cloth used for mirror-polishing (same polishing cloth for primary polishing) may be of a urethane type having a hardness (JIS-A) of 75 to 85 and a compression rate of 2 to 3%, for example. Polyurethane is preferred as the material of the polishing cloth. In particular, polyurethane foam is preferred due to its excellent degree of precision in mirror-polishing the front surface of the silicon wafer. Alternatively, suede type polyurethane or polyester unwoven fabric may be employed.

Other conditions for mirror-polishing the wafer front surface include, for example, a polishing rate of 0.1 to 0.6 μm/minute, a polishing amount of 5 to 20 μm, a polishing load of 200 to 300 g/cm$^2$, a polishing time of 10 to 90 minutes, and a temperature of the polishing liquid during polishing of 20 to 30° C. A polishing rate of less than 0.1 μm/minute is low, thus requiring a long time for polishing.

For primary polishing including free abrasive grains prior to mirror-polishing, conditions of such primary polishing include a polishing rate of 0.05 to 0.6 μm/minute and a polishing amount of 0.05 to 2 μm. With a polishing amount of less than 0.05 μm, an oxide film may not be sufficiently removed, thus likely to cause residue of the oxide film locally. With a polishing amount exceeding 2 μm, abrasive grains may cause mechanical damage in the front surface of a silicon wafer.

The surface pressure relative to the silicon wafer during mirror-polishing (same for primary polishing) is 50 to 500 g/cm$^2$. With a surface pressure of less than 50 g/cm$^2$, the polishing rate is low, thus requiring a long time for polishing. With a surface pressure exceeding 500 g/cm$^2$, scratches are likely to occur in the polished surface of the silicon wafer.

To mirror-polish the silicon wafer, a single-wafer polisher or a batch-type polisher may be used, the batch-type polisher simultaneously polishing a plurality of silicon wafers.

To polish the silicon wafer, single-side polishing of only the front surface or double-side polishing of the front and rear surfaces of the wafer simultaneously may be performed. The double-side polisher may be of a sun-gear (planetary gear) type or a no-sun gear type which simultaneously polishes the front and rear surfaces of the silicon wafer by circular motion of a carrier plate without rotation. In particular, using the double-side polisher achieves high flatness of the rear surface of the wafer in addition to the front surface thereof in one polishing, thus effectively providing a highly flat epitaxial wafer at low cost.

The same mirror-polishing conditions may be applied throughout mirror-polishing (secondary polishing) of the wafer front surface. Alternatively, mirror-polishing may be performed in the same polisher for a plurality of times with different chemical compositions and polishing conditions. For multiple-step mirror-polishing, in order to quickly remove process damage in the front layer portion of the wafer caused by slicing or grinding, polishing in the initial stage is performed, for example, at a high polishing rate by controlling the concentration of chemicals, such as the alkaline solution and water-soluble polymers, and the rotation speed of a polishing platen. Thereafter, the polishing conditions may be changed for each surface to a low polishing rate so as to prevent new process damage from occurring in the front layer portion of the wafer during mirror-polishing.

The mirror-polished silicon wafer is cleaned before epitaxial growth in order to remove chemicals and particles deposited on the front surface of the silicon wafer.

The cleaning may be known repeated SC1 cleaning, cleaning using a mixed solution of ozone and hydrofluoric acid, or repeated cleaning alternating ozone water cleaning and a hydrofluoric acid solution cleaning. Cleaning conditions including liquid types of cleaning liquid to be used for the cleaning, concentration thereof, and treatment time may be set so as to remove the front surface of a silicon wafer for 0.2 to 10 nm such that contamination is prevented in an epitaxial film to be deposited and that particles are removed.

Examples of the material of the epitaxial film may include monocrystalline silicon and polycrystalline silicone.

Examples of vapor phase epitaxy may include normal pressure vapor phase epitaxy, reduced pressure vapor phase epitaxy, and organic metal vapor phase epitaxy. In the vapor phase epitaxy, a susceptor having a circular shape from a plan view is used to house at least one epitaxial silicon wafer in a wafer housing in a lateral state (front and rear surfaces in the horizontal state). The vapor phase epitaxy may be homoepitaxy in which an epitaxial film of the same material as the wafer is deposited or heteroepitaxy in which an epitaxial film of a different material from the wafer is deposited. Properties of the epitaxial film are substantially affected by those of the wafer front surface. The film thus should have a certain thickness or greater. It is desirable, for example, to deposit an epitaxial film having a thickness of 1 to 10 μm.

First Embodiment

An embodiment of the present invention is specifically explained below. A method is explained of producing an epitaxial silicon wafer to fabricate a bipolar IC device.

With reference to FIGS. 1 to 4, a method of producing an epitaxial silicon wafer according to the first embodiment is explained.

Figure 1:
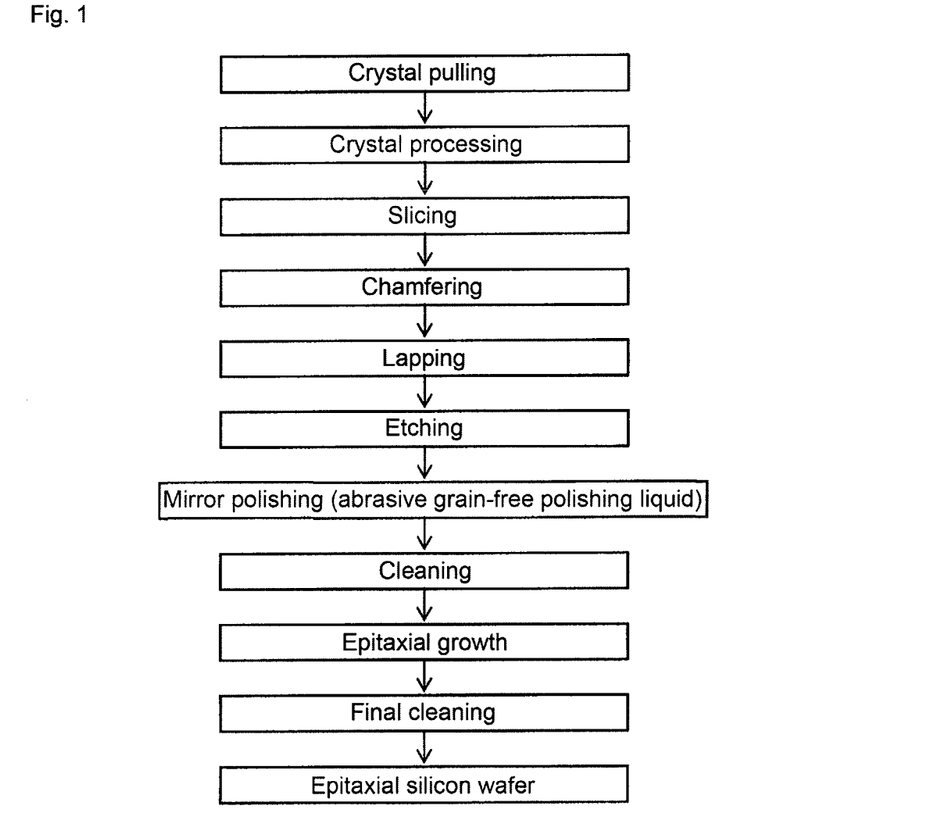
FIG. 1 is a flow sheet illustrating a method of producing an epitaxial silicon wafer according to a first embodiment of the present invention.

With reference to the flow sheet in FIG. 1, the method of producing the epitaxial silicon wafer according to the first embodiment includes crystal pulling, crystal processing, slicing, chamfering, lapping, etching, mirror-polishing, cleaning, epitaxial growth, and final cleaning.

Each process is described specifically below.

In the crystal pulling, a monocrystalline silicon ingot is pulled in the CZ process from silicon molten liquid doped with a predetermined amount of boron in a crucible, the monocrystalline silicon ingot having a diameter of 306 mm, a length of a straight body portion of 2,500 mm, a resistivity of 0.01 Ω·cm, and an initial oxygen concentration of $1.0 \times 10^{18}$ atoms/cm$^3$.

In the subsequent crystal processing, one monocrystalline silicon ingot is cut into a plurality of crystal blocks, each of whose external peripheries is then ground. Specifically, the external peripheral portion of each of the crystal blocks is ground only for 6 mm by an external periphery grinder having a resinoid grinding stone that includes #200 abrasive grains (SiC). Each of the crystal blocks is thus formed into a cylindrical shape.

In the slicing, a wire saw having a wire wound around three groove rollers positioned in a triangle shape is used. Numerous silicon wafers each having a diameter of 300 mm and a thickness of 775 μm are sliced from the monocrystalline silicon by the wire saw.

In the subsequent chamfering, a rotating chamfering stone is pressed against the external peripheral portion of the silicon wafer for chamfering.

In the lapping, a double-side lapping device is used to simultaneously lap the two surfaces of the silicon wafer. Specifically, the two surfaces of the silicon wafer are lapped between upper and lower lapping plates that rotate at a predetermined speed.

In the etching, the lapped silicon wafer is immersed in an acid etching solution in an etching tank for etching so as to remove damage caused by chamfering and lapping and a natural oxide film on the front surface of the silicon wafer. Mirror-polishing the silicon wafer with the oxide film attached to the front surface thereof using abrasive grain-free polishing liquid results in a low processing rate at the initial stage of polishing. It is thus effective to remove the oxide film on the front surface of the silicon wafer in the etching in advance.

In the mirror-polishing, the two surfaces of the silicon wafer are simultaneously mirror-polished using a no-sun gear double-side polisher and polishing liquid composed of an abrasive grain-free alkaline solution in which water-soluble polymers are added.

The no-sun gear double-side polisher is specifically explained with reference to FIGS. 2 and 3.

Figure 2:
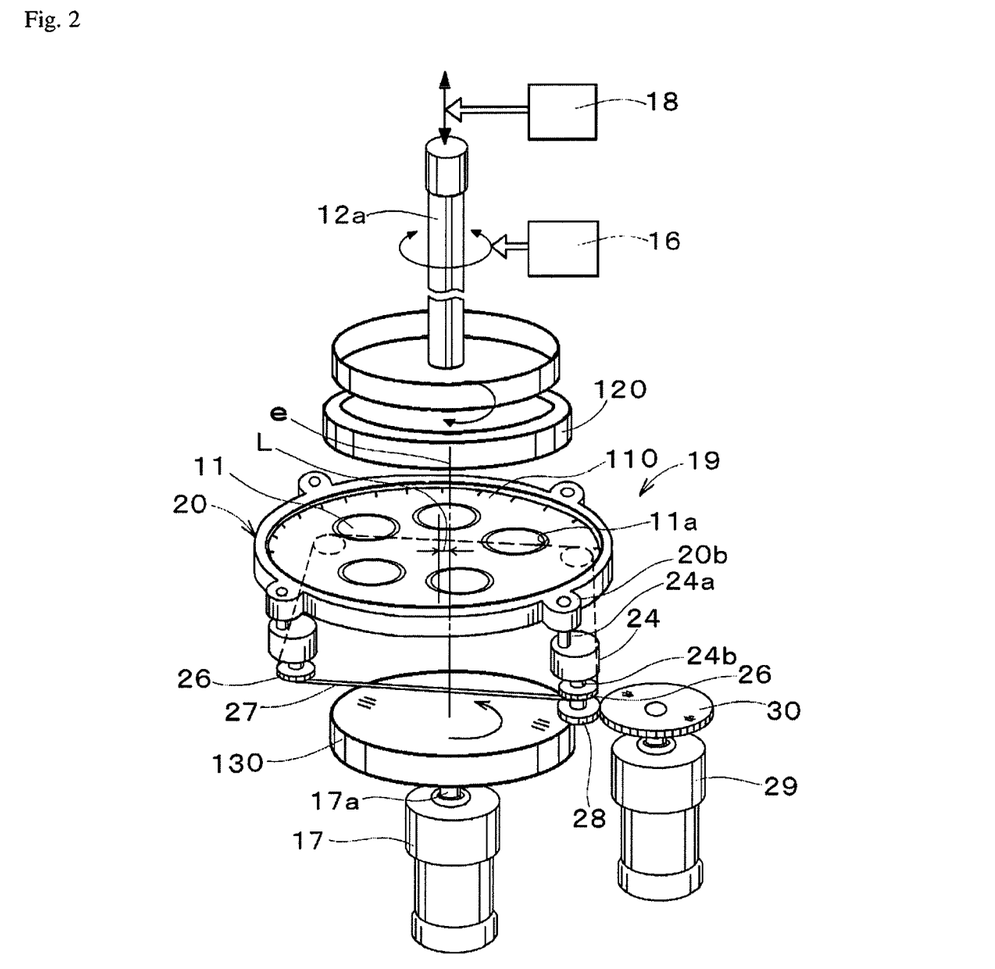
FIG. 2 is a perspective view of a no-sun gear double-side polisher used in the method of producing the epitaxial silicon wafer according to the first embodiment of the present invention.
Figure 3:
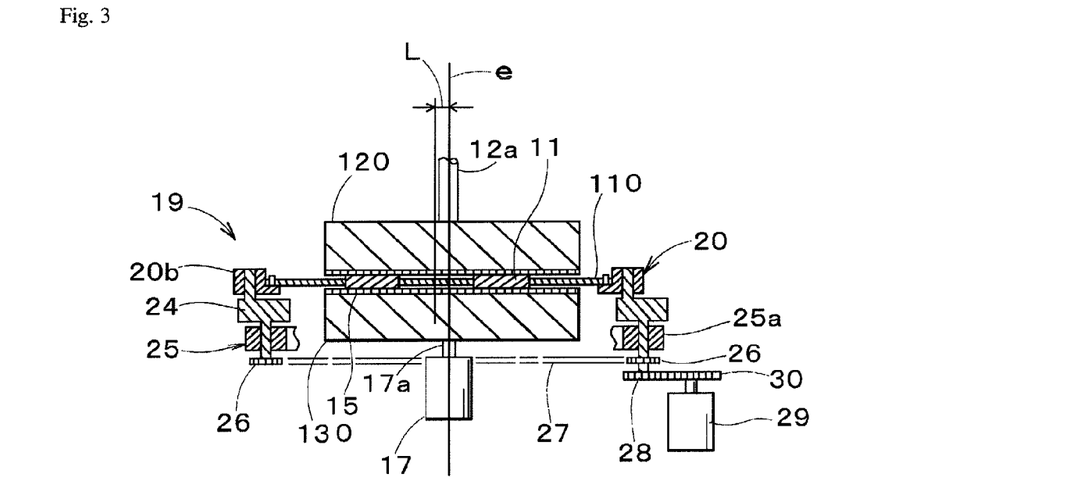
FIG. 3 is a vertical cross-sectional view of a main portion of the no-sun gear double-side polisher used in the method of producing the epitaxial silicon wafer according to the first embodiment of the present invention.

As shown in FIGS. 2 and 3, an upper platen 120 of the double-side polisher is rotated and driven within a horizontal surface by an upper rotating motor 16 through a rotating axis 12a extending upward. The upper platen 120 is vertically moved up and down by a lift 18, which moves the upper platen 120 in an axial direction. The lift 18 is used to supply and eject a silicon wafer 11 to and from a carrier plate 110. The pressure on the front and rear surfaces of the silicon wafer 11 from the upper platen 120 and a lower platen 130, respectively, is exerted by a pressing unit, such as an air bag (not shown in the drawings), installed in each of the upper platen 120 and the lower platen 130. The lower platen 130 is rotated within the horizontal surface by a lower rotating motor 17 through its output shaft 17a. A carrier circular motion mechanism 19 causes the carrier plate 110 to perform circular motion within a surface parallel to a front surface of the plate 110 (horizontal surface) such that the plate 110 itself is not rotated.

The carrier circular motion mechanism 19 has an annular carrier holder 20 that externally holds the carrier plate 110. The carrier circular motion mechanism 19 and the carrier holder 20 are connected through an interlock structure.

Four axis receivers 20b are provided to an external peripheral portion of the carrier holder 20, the axis receivers 20b projecting externally and being provided every 90 degrees. Each of the axis receivers 20b is inserted and fixed with an eccentric axis 24a, which extends at an eccentric position on an upper surface of an eccentric arm 24 having a small-diameter circular plate shape. A rotation axis 24b is provided perpendicularly at a central portion of a lower surface of each of the four eccentric arms 24. The rotation axis 24b is inserted and fixed to an axis receiver 25a in a state in which an end portion of the rotation axis 24b projects downward. A total of four axis receivers 25a are provided every 90 degrees to an annular apparatus main body 25. A sprocket 26 is fixed to the end portion projecting downward of each of the rotation axes 24b. A timing chain 27 is continuously provided to the sprockets 26 in a horizontal state. The four sprockets 26 and the timing chain 27 rotate the four rotation axes 24b simultaneously such that the four eccentric arms 24 perform a circular motion synchronously.

One of the four rotation axes 24b is provided with a longer length such that the end portion projects downward further than the sprocket 26. A gear 28 for power transmission is fixed to the projecting portion. The gear 28 is engaged with a large-diameter gear 30 for driving, which is fixed to the output axis extending upward of a circular motion motor 29.

With activation of the circular motion motor 29, a rotation force thereof is transmitted to the timing chain 27 through the gears 30 and 28 and the sprocket 26 fixed to the long rotation axis 24b. Circumferential rotation of the timing chain 27 synchronously rotates, through the remaining three sprockets 26, the four eccentric arms 24 centering the rotation axes 24b within the horizontal surface. Thereby, the carrier holder 20 integrally connected to the eccentric axes 24a, and thus the carrier plate 110 held by the holder 20 perform circular motion involving no rotation, within the horizontal surface parallel to the plate 110.

Specifically, the carrier plate 110 circles in an eccentric state for a distance L from an axial line e of the upper platen 120 and the lower platen 130. An urethane polishing cloth 15 is attached to each of the opposing surfaces of the both platens 120 and 130, the polishing cloth 15 having a hardness (JIS-A) of 80 and a compression rate of 2.5%.

The distance L is identical to a distance between the eccentric axis 24a and the rotation axis 24b. The circular motion involving no rotation allows all points on the carrier plate 110 to follow a trajectory of a same-size (radius r) small circle. The two polishing platens 120 and 130 are rotated in opposite directions; and the rotation speed of the polishing platens 120 and 130, the polishing pressure, and the polishing time are adjusted such that the two sides of the silicon wafer 11 housed in a wafer housing 11a provided in the carrier plate 110 are simultaneously mirror-polished for a polishing amount of 6 μm on one side (12 μm on both sides). For the double-side polishing, the polishing cloths 15 are used with abrasive grain-free polishing liquid composed of an amine solution (alkaline solution) having a pH of 10.5 in which 100 ppm of hydroxyethyl cellulose (water-soluble polymers) is added.

As described above, the polishing liquid for mirror-polishing is composed of the abrasive grain-free amine solution in which hydroxyethyl cellulose is added. Thus, a portion of polishing load during polishing is borne by hydroxyethyl cellulose, thus reducing friction coefficient. As a result, gate oxide integrity is excellent; occurrence of defects attributable to processing, such as micro scratches, is substantially reduced; and the density of LPDs in the front surface of the epitaxial film formed thereafter is reduced. Furthermore, the surface roughness of the front surface of the silicon wafer 11 is reduced, and the surface roughness quality of the epitaxial film formed thereafter is enhanced.

Adding hydroxyethyl cellulose to the amine solution prevents elastic deformation of the carrier plate 110 and reduces noise from the carrier plate 110. Furthermore, possibility of external periphery sagging is also reduced, the external periphery sagging being caused by excessive polishing in the external peripheral portion of the silicon wafer 11 due to abrasive grains in the polishing liquid likely to aggregate in the external peripheral portion of the silicon wafer 11.

A diethylene triamine pentaacetic acid (DTPA, chelator) may be added to the alkaline solution of the polishing liquid. The added chelator catches and complexes metal ions, such as copper ions, included in the polishing liquid, thus reducing the level of metal contamination in the polished silicon wafer.

The mirror-polished silicon wafer 11 is cleaned. In the present embodiment, the silicon wafer 11 undergoes SC1 cleaning that uses an alkaline solution and an acid solution.

The epitaxial growth using a single-wafer vapor phase epitaxy apparatus is specifically explained with reference to FIG. 4.

Figure 4:
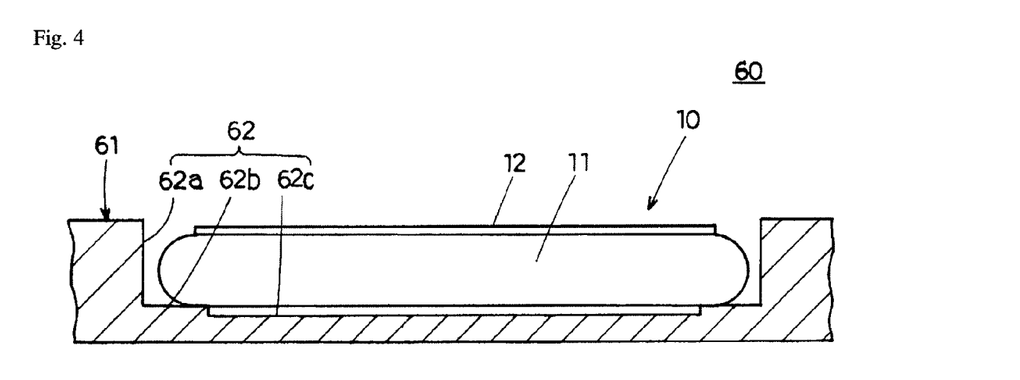
FIG. 4 is an enlarged vertical cross-sectional view of a main portion of a vapor phase epitaxy apparatus used in the method of producing the epitaxial silicon wafer according to the first embodiment of the present invention.

As shown in FIG. 4, a vapor phase epitaxy apparatus 60 has a chamber provided with heaters above and below and accommodating a susceptor 61 in a central portion thereof, the susceptor 61 having a circular shape from a plan view and being horizontally placed to hold a single silicon wafer 11. The susceptor 61 is composed of a carbon base material coated with SiC.

A caved-in portion (wafer housing) 62 is provided in an internal peripheral portion of an upper surface of the susceptor 61 to house the silicon wafer 11 laterally (front and rear surfaces in the horizontal state). The caved-in portion 62 has a peripheral wall 62a, a step 62b having a width of 6 mm and an annular shape from a plan view, and a bottom plate (bottom wall surface of the caved-in portion) 62c.

A gas inlet is provided in a side portion of the chamber to supply predetermined carrier gas ($H_2$ gas) and predetermined source gas ($SiHCl_3$ gas) to an upper space of the chamber in parallel to the wafer front surface. A gas outlet is provided in another side portion of the chamber.

During the epitaxial growth, the silicon wafer 11 is placed laterally in the caved-in portion 62 such that the front and rear surfaces of the wafer are horizontal. In order to remove a natural oxide film and particles on the front surface of the silicon wafer 11, hydrogen gas is then supplied into the chamber to perform a hydrogen bake at a temperature of 1,150° C. for 60 seconds. In place of the hydrogen gas, carrier gas ($H_2$ gas) and source gas ($SiHCl_3$ gas) are subsequently supplied into the chamber to deposit an epitaxial film 12 on the front surface of the silicon wafer 11. Specifically, the carrier gas and source gas are introduced to a reactor through the gas inlet. At an internal chamber pressure of 100±20 KPa, silicon generated by pyrolysis or reduction of the source gas is deposited on the silicon wafer 11 heated to a high temperature of 1,000° C. to 1,150° C. at a reaction speed of 3.5 to 4.5 μm/minute. Thereby, the epitaxial film 12 composed of monocrystalline silicon having a thickness of approximately 10 μm is deposited on the front surface of the silicon wafer 11. Thus, the epitaxial silicon wafer 10 is produced.

In the final cleaning, the epitaxial silicon wafer 10 undergoes the final cleaning immediately after external appearance inspection. Specifically, the epitaxial silicon wafer 10 is cleaned using an alkaline solution and an acid solution.

Second Embodiment

A method of producing an epitaxial silicon wafer according to the second embodiment of the present invention is explained below with reference to FIGS. 5 to 13.

Figure 5:
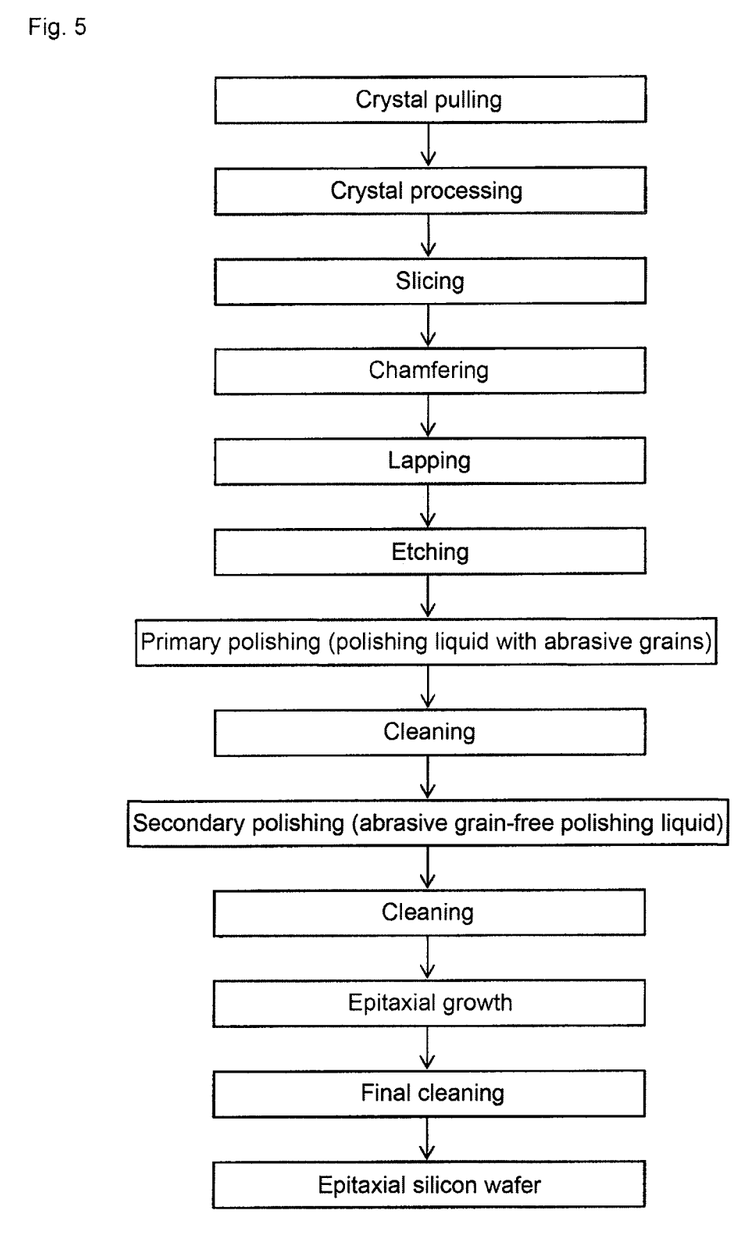
FIG. 5 is a flow sheet illustrating a method of producing an epitaxial silicon wafer according to a second embodiment of the present invention.
Figure 6:
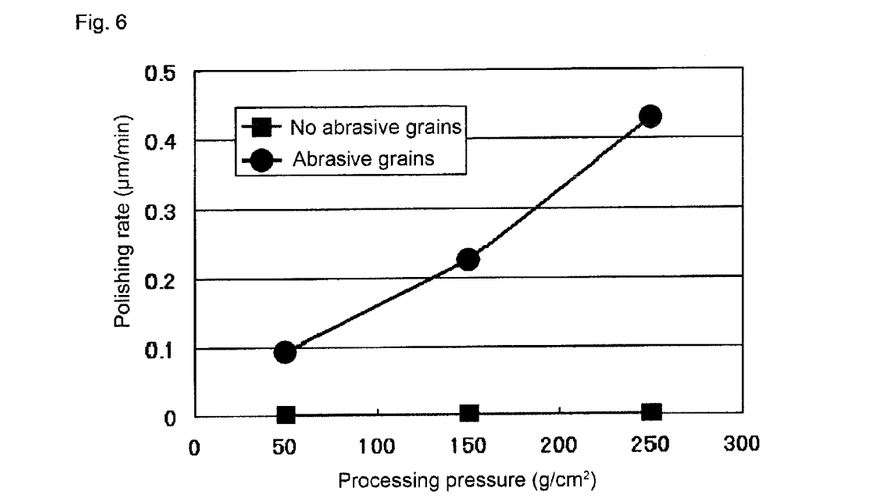
FIG. 6 is a graph illustrating a relationship between processing pressure and polishing rate in a case where a front surface of a silicon wafer is polished using polishing liquid including abrasive grains and abrasive grain-free polishing liquid in the method of producing the epitaxial silicon wafer according to the second embodiment of the present invention.

With reference to FIG. 5, the method of producing the epitaxial silicon wafer according to the second embodiment includes crystal pulling, crystal processing, slicing, chamfering, lapping, etching, primary polishing, cleaning, secondary polishing (mirror-polishing), cleaning, epitaxial growth, and final cleaning.

A no-sun gear double-side polisher used for mirror-polishing in the first embodiment is used in the primary polishing. The two polishing platens 120 and 130 are rotated in opposite directions; and the rotation speed of the polishing platens 120 and 130, the polishing pressure, and the polishing time are adjusted such that two surfaces of the silicon wafer 11 housed in the wafer housing 11a provided in the carrier plate 110 undergo simultaneous primary polishing for a polishing amount of 0.5 μm on one side (1 μm on both sides). Primary polishing liquid is supplied to the polishing cloths 15 during the double-side primary polishing, the primary polishing liquid being composed of an amine solution having a pH of 10.5 in which 3 weight % of colloidal silica particles having an average grain size of 70 nm is added.

As described above, the polishing liquid for primary polishing is composed of the amine solution including abrasive grains. A natural oxide film of approximately 10 Å existing each on the front and rear surfaces of the silicon wafer 11 is thus removed in a short period of time by mechanical action of the abrasive grains in a pre-process of secondary polishing that does not include abrasive grains. This allows mirror-polishing at a high polishing rate in the secondary polishing, the mirror-polishing being performed by chemical action in which alkaline etching using an alkaline solution and removal of an etched portion are repeated.

Specifically, a natural oxide film generally exists on the wafer front surface in the primary polishing performed after a predetermined period of time elapses from etching. It is difficult to remove the natural oxide film only in the secondary polishing, which is performed by chemical action without abrasive grains. This is demonstrated in FIG. 6, which illustrates that even if processing pressure (polishing pressure) is increased, the polishing rate is substantially 0 in the case of polishing using polishing liquid only composed of an alkaline solution. In the second embodiment, the primary polishing using abrasive grains is thus performed prior to the secondary polishing. This reduces the removal time of the natural oxide film and prevents a reduction in productivity of epitaxial silicon wafers.

In the cleaning after the primary polishing, the primary-polished silicon wafer 11 undergoes SC1 cleaning that uses an alkaline solution and an acid solution.

Subsequently, the secondary polishing (corresponding to the mirror-polishing in the first embodiment) is performed using the no-sun gear double-side polisher used in the primary polishing. The front and rear surfaces of the cleaned silicon wafer 11 undergo the secondary polishing (corresponding to the mirror-polishing in the first embodiment) with secondary polishing liquid (corresponding to the polishing liquid in the first embodiment) composed of an abrasive grain-free amine solution (alkaline solution) in which hydroxyethyl cellulose (water-soluble polymers) is added. Specifically, the two polishing platens 120 and 130 are rotated in opposite directions; and the rotation speed of the polishing platens 120 and 130, the polishing pressure, and the polishing time are adjusted such that the two surfaces of the silicon wafer 11 housed in the wafer housing 11a provided in the carrier plate 110 undergo simultaneous secondary polishing for a polishing amount of 6 μm on one side (12 μm on both sides). The secondary polishing liquid is supplied to polishing cloths 15 during the secondary polishing, the secondary polishing liquid being composed of an amine solution having a pH of 10.5 in which 100 ppm of hydroxyethyl cellulose is added.

The silicon wafer 11 is cleaned after the secondary polishing. In the present embodiment, the silicon wafer 11 undergoes SC1 cleaning that uses an alkaline solution and an acid solution.

As described above, only the primary cleaning and secondary cleaning are performed without finish polishing to produce the epitaxial silicon wafer 10. The simplified polishing enhances productivity of the epitaxial silicon wafers 10 and reduces the cost. Compared with conventional primary polishing alone including free abrasive grains, the density of LPDs is reduced, the LPDs being attributable to processing and occurring in the front surface of the secondary polished wafer. Thus, the surface roughness of the wafer surface is reduced.

Other configurations, functions, and effects are inferable from the first embodiment and thus explanations thereof are omitted.

Figure 7:
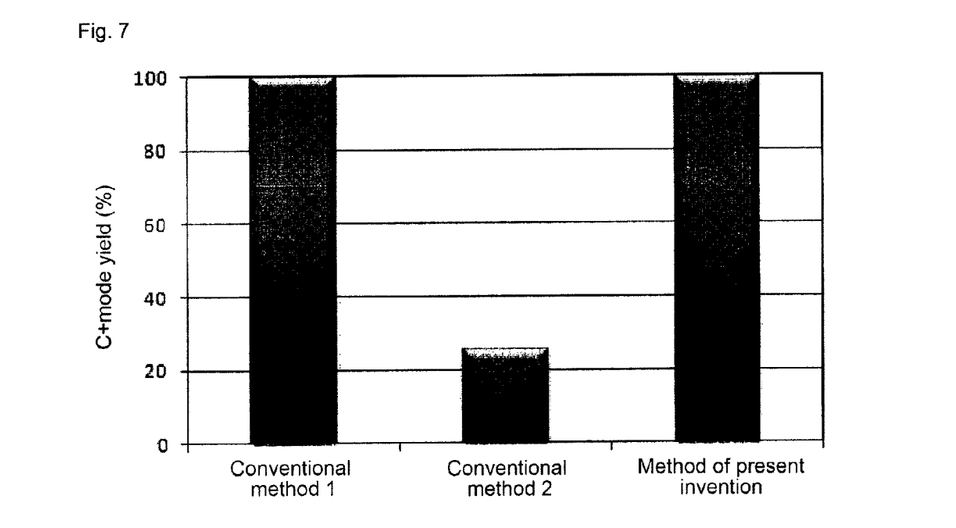
FIG. 7 is a graph illustrating evaluation results of gate oxide integrity of a mirror-polished silicon wafer (PW) in a case where a wafer is polished using abrasive grain-free polishing liquid under the conditions of the second embodiment of the present invention and in a case where a wafer is polished using polishing liquid including abrasive grains in two conventional methods.

With reference to FIG. 7, results of gate oxide integrity (C+mode yield in TZDB measurement) evaluation of the mirror-polished silicon wafer (PW) are reported below in cases where primary polishing and then abrasive grain-free secondary polishing were performed in accordance with the conditions in the second embodiment of the present invention; where general primary polishing, secondary polishing, and tertiary polishing (finish polishing) were sequentially performed (conventional method 1); and where only primary polishing including abrasive grains (colloidal silica) was performed (conventional method 2). The results are based on evaluation after SC1 cleaning in each of the cases. For the cleaning, SC1 cleaning liquid prepared by mixing at a volume ratio of $NH_4OH:H_2O_2:H_2O=1:2:7$ was used to remove each wafer front surface for 4 nm.

As demonstrated in the graph in FIG. 7, the C+mode yield was less than 30% in the conventional method 2 that used polishing liquid including abrasive grains. In contrast, in the method according to the present invention in which a natural oxide film on the wafer front surface was removed in primary polishing including abrasive grains and then polishing liquid composed of the abrasive grain-free alkaline solution in which the water-soluble polymers were added was used, the C+mode yield was 99.7%, which was approximately the same as that of the general conventional method 1 that included primary through tertiary cleaning.

Figure 8:
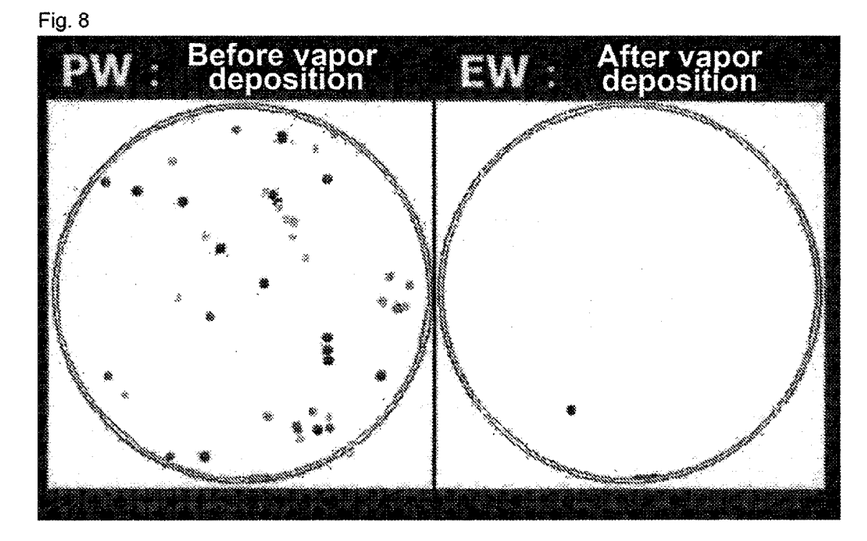
FIG. 8 illustrates LPD distributions each in a front surface of a silicon wafer that undergoes mirror-polishing (secondary polishing) with abrasive grain-free polishing liquid according to the second embodiment of the present invention and in a front surface of an epitaxial silicon wafer having an epitaxial film deposited on the front surface of this wafer.
Figure 9:
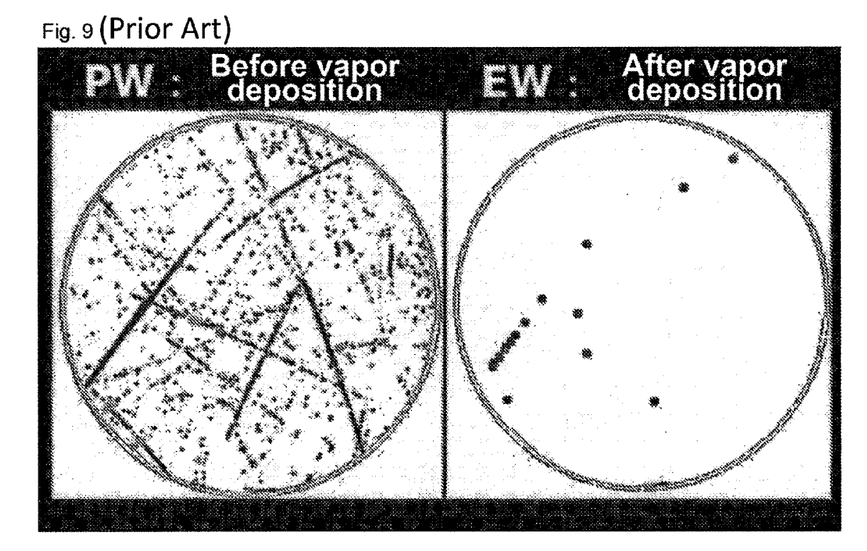
FIG. 9 illustrates LPD distributions each in a front surface of a conventional silicon wafer that has undergone mirror-polishing with polishing liquid including abrasive grains and in a front surface of an epitaxial silicon wafer having an epitaxial film deposited on the front surface of this wafer.

With reference to LPD distributions in FIGS. 8 and 9, results of measurement using a particle counter are reported below with respect to the number of LPDs of a single silicon wafer (PW) having a mirror-polished front surface and the number of LPDs of a single wafer in a front surface of an epitaxial film deposited on a mirror-polished surface (130 nm or greater is counted in each case) in the method of the present invention (second embodiment; FIG. 8) and the conventional method (FIG. 9). The method of the present invention herein refers to two-step polishing in which polishing liquid including abrasive grains is used in primary polishing of the front surface of the silicon wafer and abrasive grain-free polishing liquid is used in secondary polishing under the condition of the second embodiment. The conventional method refers to performing of primary polishing alone using polishing liquid composed of an alkaline solution including abrasive grains.

Each drawing illustrates the results of the silicon wafer (PW) on the left side and of the epitaxial silicon wafer (EW) on the right side. The results are based on evaluation after SC1 cleaning in each of the cases. For the cleaning, SC1 cleaning liquid prepared by mixing at a volume ratio of $NH_4OH:H_2O_2:H_2O=1:2:7$ was used to remove each front surface for 4 nm.

For LPD measurement, a KLA Tencor Surfscan SP2 "SP2XP" was used. This particle counter collects, by a collector, photons of scattering laser light irradiated obliquely at 20° relative to the front surface of the sample wafer and amplifies and converts the obtained photons into electric signals by a photoelectron amplifying tube. Subsequently, the electric signals are converted into scattering intensity, and then the scattering light above a threshold is converted into a predetermined size according to a calibration curve. The measurement value herein was an average of five wafers.

Based on the results of measurement, the number of detected LPDs was 142.60 per wafer in the front surface of the silicon wafer that underwent primary polishing with abrasive grains and then abrasive grain-free secondary polishing according to the present invention (PW in FIG. 8); and the number of detected LPDs was 2.7500 per wafer in the front surface of the epitaxial silicon wafer (EW in FIG. 8). In contrast, the number of detected LPDs was 1,851.00 per wafer in the front surface of the silicon wafer that is mirror-polished using polishing liquid including abrasive grains according to a conventional method (PW in FIG. 9), and the number of detected LPDs was 10.5000 per wafer in the front surface of the epitaxial silicon wafer (EW in FIG. 9).

As demonstrated in the LPD distributions in FIGS. 8 and 9, the occurrence of LPDs in the mirror-polished surface of the silicon wafer and the occurrence of LPDs in the front surface of the epitaxial film deposited on this mirror-polished surface were reduced in the method according to the present invention in which primary polishing with abrasive grains was performed and then abrasive grain-free secondary polishing was performed, compared with the conventional method in which only primary polishing was performed using polishing liquid including abrasive grains. Although a limited number of LPDs were observed in the LPD evaluation results of the silicon wafer (PW) according to the method of the present invention in FIG. 8, the oxide gate integrity (C+mode yield in TZDB measurement) of the silicon wafer (PW) was substantially 100% (FIG. 7) as demonstrated above in the experiment results. It is thus considered that the LPDs observed in FIG. 8 are not attributed to processing, such as process damage, but particles. Even if the LPDs are attributable to processing, the sizes of process damage are identified so small that they do not affect the C+mode yield, thus unlikely to affect the quality of the front surface of the epitaxial film.

Figure 10:
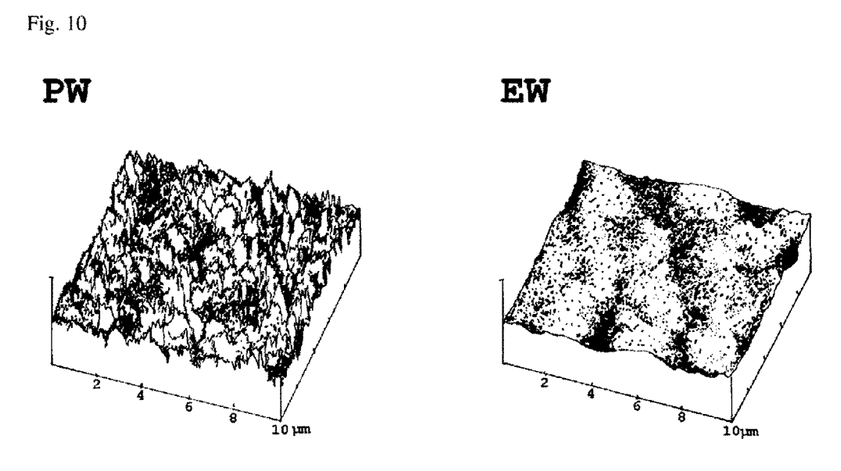
FIG. 10 is a three-dimensional graph illustrating surface roughness observed by an atomic force microscope in a measurement area of 10 $\mu$m×10 $\mu$m of a front surface of a silicon wafer (PW) mirror-polished using abrasive grain-free polishing liquid according to the second embodiment of the present invention, and of a front surface of an epitaxial silicon wafer (EW) having an epitaxial film deposited on the front surface of this wafer.
Figure 11:
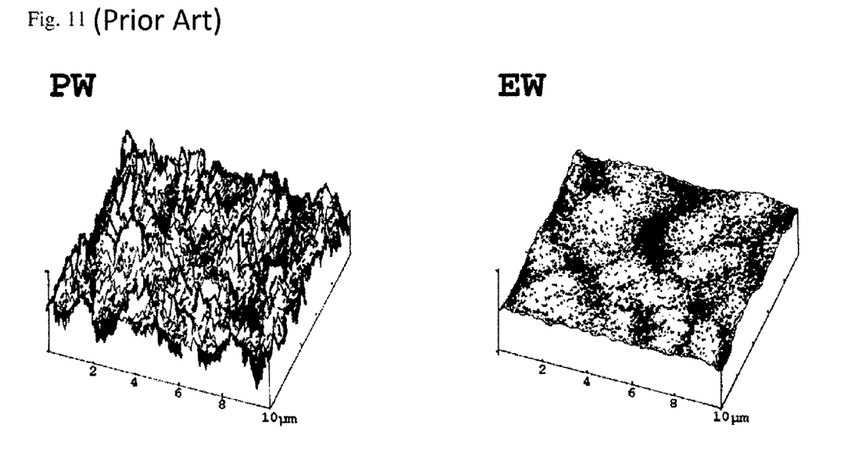
FIG. 11 is a three-dimensional graph illustrating surface roughness observed by an atomic force microscope in a measurement area of 10 $\mu$m×10 $\mu$m of a front surface of a conventional silicon wafer mirror-polished using polishing liquid including abrasive grains, and of a front surface of an epitaxial silicon wafer having an epitaxial film deposited on the front surface of this wafer.
Figure 12:
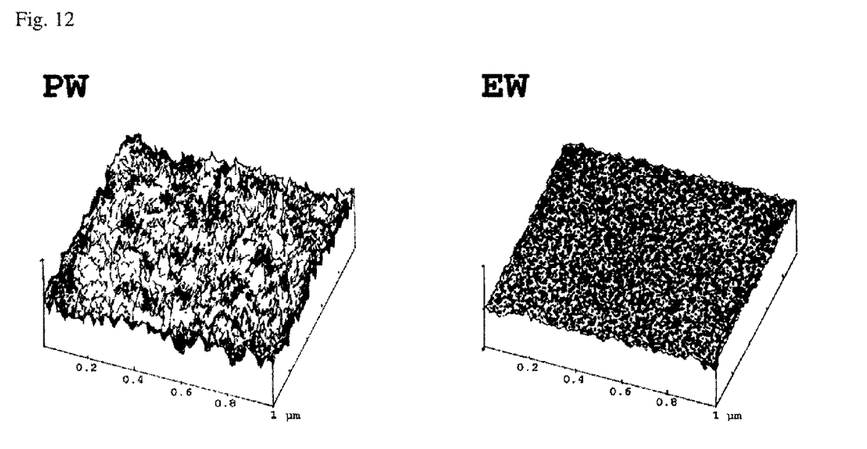
FIG. 12 is a three-dimensional graph illustrating surface roughness observed by an atomic force microscope in a measurement area of 1 $\mu$m×1$\mu$m of a front surface of a silicon wafer mirror-polished using abrasive grain-free polishing liquid according to the second embodiment of the present invention, and of a front surface of an epitaxial silicon wafer having an epitaxial film deposited on the front surface of this wafer.
Figure 13:
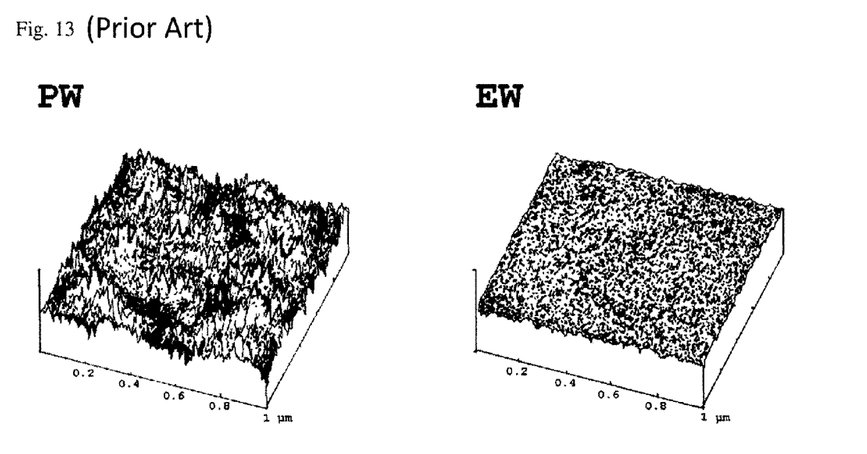
FIG. 13 is a three-dimensional graph illustrating surface roughness observed by an atomic force microscope in a measurement area of 1 $\mu$m×1 $\mu$m of a front surface of a conventional silicon wafer mirror-polished using polishing liquid including abrasive grains, and of a front surface of an epitaxial silicon wafer having an epitaxial film deposited on the front surface of this wafer.

The surface roughness is reported below with reference to FIGS. 10 to 13, based on observation of a measurement area of 10 μm×10 μm (FIGS. 10 and 11) and a measurement area of 1 μm×1 μm (FIGS. 12 and 13) using an atomic force microscope with respect to the front surface of the silicon wafer (PW) and the epitaxial silicon wafer (EW) after epitaxial growth in the method of the present invention (second embodiment; FIGS. 10 and 12) and the conventional method (FIGS. 11 and 13). The results herein are based on evaluation after SC1 cleaning of the front surfaces of the silicon wafer (PW) and the epitaxial silicon wafer (EW). The cleaning conditions include use of SC1 (Standard Cleaning 1) cleaning liquid prepared by mixing at a volume ratio of $NH_4OH:H_2O_2:H_2O=1:2:7$ and removal of each front surface for 4 nm.

For surface roughness (roughness) observation, a Veeco atomic force microscope "Multi Mode AFM" was used. The apparatus is a tapping AFM in which a cantilever is vibrated in the vicinity of a resonance frequency (amplitude of 20 to 100 nm) and the cantilever is intermittently contacted on the front surface of the sample wafer to observe the unevenness of the wafer front surface. The apparatus has a dynamic force detection mode, a resolution of 1 nm, a force exerted on the sample wafer of 0.1 to 1 nN in the air, a measurement point of 1 per wafer (center), and a roughness index (average amplitude parameter in the height direction) represented by root-mean-square roughness (old RMS).

Based on the results of the observation, the surface roughness in the measurement area of 10 μm×10 μm of the front surface of the silicon wafer mirror-polished according to the two-step polishing, including primary and secondary polishing, of the method of the present invention was 0.277 nm in RMS (PW in FIG. 10). The surface roughness of the same measurement area of the front surface of the epitaxial area was 0.100 nm in RMS (EW in FIG. 10).

In contrast, the surface roughness in the measurement area of 10 μm×10 μm of the front surface of the silicon wafer that underwent primary mirror-polishing with polishing liquid including abrasive grains according to the conventional method was 0.458 nm in RMS (PW in FIG. 11). The surface roughness of the same measurement area of the front surface of the epitaxial area was 0.132 nm in RMS (EW in FIG. 11).

As demonstrated in FIGS. 10 and 11, the method of the present invention performing the two-step cleaning improves (reduces) the surface roughness of the mirror-polished surface of the silicon wafer and the front surface of the epitaxial film deposited on this mirror-polished surface, compared with the conventional method performing only primary polishing with polishing liquid including free abrasive grains.

The surface roughness in the measurement area of 1 μm×1 μm of the front surface of the silicon wafer that underwent the two-step polishing according to the method of the present invention was 0.223 nm in RMS (PW in FIG. 12). The surface roughness in the measurement area of 1 μm×1 μm of the front surface of the epitaxial silicon wafer was 0.097 nm in RMS (EW in FIG. 12).

In contrast, the surface roughness in the measurement area of 1 μm×1 μm of the front surface of the silicon wafer that underwent primary polishing with polishing liquid including abrasive grains according to the conventional method was 0.311 nm in RMS (PW in FIG. 13). The surface roughness in the same measurement area of the front surface of the epitaxial silicon wafer was 0.103 nm in RMS (EW in FIG. 13).

As demonstrated in FIGS. 12 and 13, the surface roughness of the mirror-polished surface of the silicon wafer and the front surface of the epitaxial film is reduced in the method of the present invention compared with the conventional method.

The present invention is useful as a method of producing an epitaxial silicon wafer to be used as a substrate for fabrication of a device such as a bipolar IC, a MOS, or a discrete.

What is claimed is:

1. A method of producing an epitaxial silicon wafer, the method comprising:
   simultaneously mirror-polishing a front surface and a rear surface of a silicon wafer using polishing liquid comprising an abrasive grain-free alkaline solution in which water-soluble polymers are added; and
   vapor-depositing after the mirror-polishing an epitaxial film on the mirror-polished front surface of the silicon wafer,
   wherein the method of producing the epitaxial silicon wafer further comprises:
      performing primary polishing prior to the mirror-polishing, the primary polishing using primary polishing liquid mainly comprising the alkaline solution and intervening abrasive grains to remove an oxide film formed on the front surface of the silicon wafer, wherein
      the mirror-polishing is secondary polishing using the polishing liquid as secondary polishing liquid,
      after the mirror-polishing, the front surface of the silicon wafer is cleaned by using a SC1 cleaning liquid consisting of $NH_4OH$, $H_2O_2$, and $H_2O$,
      after the cleaning, the epitaxial film is vapor-deposited on the mirror-polished front surface of the silicon wafer,
      the alkaline solution is an amine solution having a pH of 8 to 14,
      the water-soluble polymers are hydroxyethyl cellulose and concentration of the water-soluble polymers is 0.01 ppm to 1,000 ppm, and
   measuring a surface roughness in both a 1 μm×1 μm measurement area and a 10 μm×10 μm measurement area using an atomic force microscope, wherein the front surface of the mirror-polished silicon wafer has a surface roughness of less than 0.3 nm in RMS in measurement of the 1 μm×1 μm measurement area using the atomic force microscope and a surface roughness of 0.3 nm or less in RMS in measurement of the 10 μm×10 μm measurement area of using the atomic force microscope.

2. A method of producing an epitaxial silicon wafer, the method comprising:
   simultaneously mirror-polishing a front surface and a rear surface of a silicon wafer using polishing liquid comprising an abrasive grain-free alkaline solution in which water-soluble polymers are added;
   vapor-depositing after the mirror-polishing an epitaxial film on the mirror-polished front surface of the silicon wafer;
   performing primary polishing prior to the mirror-polishing, the primary polishing using primary polishing liquid mainly comprising the alkaline solution and intervening abrasive grains to remove an oxide film formed on the front surface of the silicon wafer, wherein
      the mirror-polishing is secondary polishing using the polishing liquid as secondary polishing liquid, after the mirror-polishing, the front surface of the silicon wafer is cleaned by using a SC1 cleaning liquid consisting of $NH_4OH$, $H_2O_2$, and $H_2O$, after the cleaning, an epitaxial film is vapor-deposited on the mirror-polished front surface of the silicon wafer, the alkaline solution is an amine solution having a pH of 8 to 14, and the water-soluble polymers are hydroxyethyl cellulose and concentration of the water-soluble polymers is 0.01 ppm to 1,000 ppm; and evaluating gate oxide integrity after the mirror polishing, wherein the evaluating the gate oxide integrity of the mirror-polished silicon wafer indicates a C+mode yield is 99% or greater in TZDB measurement.

* * * * *

UNITED STATES PATENT AND TRADEMARK OFFICE
CERTIFICATE OF CORRECTION

PATENT NO. : 8,728,942 B2
APPLICATION NO. : 13/390764
DATED : May 20, 2014
INVENTOR(S) : S. Ogata et al.

It is certified that error appears in the above-identified patent and that said Letters Patent is hereby corrected as shown below:

On the Title Page, under item (73) Assignees, of the printed patent, "Sumico Corporation, Tokyo (JP)" should read --Sumco Corporation, Tokyo (JP)--.

Signed and Sealed this
Sixteenth Day of September, 2014

Michelle K. Lee
*Deputy Director of the United States Patent and Trademark Office*